(12) United States Patent  (10) Patent No.: US 7,134,635 B2
Burriel et al.  (45) Date of Patent: Nov. 14, 2006

(54) RAIL MOUNTING SYSTEM FOR THIN CLIENTS

(75) Inventors: Jack M. Burriel, Discovery Bay, CA (US); Paul Noble-Campbell, Austin, TX (US); Jeff Mulhausen, Austin, TX (US)

(73) Assignee: WYSE Technology Inc., San Jose, CA (US)

( * ) Notice: Subject to any disclaimer, the term of this patent is extended or adjusted under 35 U.S.C. 154(b) by 0 days.

(21) Appl. No.: 10/949,201

(22) Filed: Sep. 27, 2004

(65) Prior Publication Data

US 2006/0065804 A1    Mar. 30, 2006

(51) Int. Cl.
*A47B 97/00* (2006.01)
(52) U.S. Cl. ............... 248/500; 248/225.11; 312/223.2
(58) Field of Classification Search ................ 248/500, 248/506, 677, 224.8, 225.11, 220.21; 403/381, 403/387; 312/223.2, 351.1, 351.2; 361/681, 361/682
See application file for complete search history.

(56) References Cited

U.S. PATENT DOCUMENTS

| | | | | | |
|---|---|---|---|---|---|
| 3,938,869 | A | * | 2/1976 | Josey | 312/100 |
| 5,205,420 | A | * | 4/1993 | Petryszak | 211/43 |
| 5,664,793 | A | * | 9/1997 | Engibarov | 279/124 |
| 5,749,637 | A | * | 5/1998 | McMahan et al. | 312/223.2 |
| 5,887,962 | A | * | 3/1999 | Tsai | 312/351.9 |
| 6,626,709 | B1 | * | 9/2003 | Cisey | 439/717 |
| 6,836,405 | B1 | * | 12/2004 | Alfonso et al. | 361/683 |
| 2003/0231460 | A1 | * | 12/2003 | Moscovitch | 361/681 |

* cited by examiner

*Primary Examiner*—Ramon O Amirez
(74) *Attorney, Agent, or Firm*—McDermott Will & Emery LLP

(57) ABSTRACT

A mounting system for a device encasement, including an elongated, T-shaped tenon rail, the T-shaped tenon rail being affixed to the device encasement. One or more detachable mounts may be detachably affixed to the T-shaped tenon rail. The T-shaped tenon rail is permanently affixed or detachably affixed to the device encasement. The device encasement encases a computing device. The T-shaped tenon rail is comprised of plastic or metal.

28 Claims, 10 Drawing Sheets

RAIL MOUNTING SYSTEM FOR THIN CLIENTS

FIELD OF THE INVENTION

The present invention relates to a mounting system and, more particularly, relates to the detachable mounting of encasements for computing devices or the like using dovetailing tenon rails and mortises affixed to the device encasement and mount, respectively.

DESCRIPTION OF THE RELATED ART

The design of a conventional device encasement is typically based upon functional considerations and operating requirements of the device encasement, such as manufacturing ease, component size and location, ventilation requirements, design economy, proximity of input and output cabling, maintenance access, expandability, et cetera. The same industrial design elements which make conventional device encasements functional, however, often negatively affect a user's ability to mount or otherwise position the device encasement in a given workspace.

One classic example of a highly functional device encasement is that of a conventional personal computer ("PC") central processing unit ("CPU"). From a functional standpoint, a typical CPU encasement is easy and inexpensive to manufacture and repair, offering plenty of interior space for existing and future components and ventilation equipment. On the other hand, known CPU encasements are heavy and have an uneven weight distribution, include sharp corner edges, are large, boxy and generally unsightly, and may or may not be positioned or mounted vertically or horizontally based upon factors which upon not readily visible to the operator.

Due to the shape of their encasements, CPUs are often jammed under or between desks where ventilation is poor and where the device encasements are prone to be kicked or have objects dropped on them. When placed on a desktop, CPU encasements are often improperly laid on their sides or up-ended, or items such as flammable materials or liquids are often placed on top of them, creating fire hazards and increasing the risk of catastrophic equipment failure.

One approach used by industrial designers to dictate the workspace positioning or orientation of a device is to incorporate mounts into the device encasement design. Mounts, such as rubber feet, articulating arms, rack mounts, foot mounts, stands, or wall mounts, can be added to a device encasement which has been fitted to accept a mount, such as by drilling holes into the device encasement. Alternatively, mounts can simply be applied to the exterior of an existing encasement using an adhesive or other external locking mechanism. By placing a mount on a device encasement, the industrial designer can prevent the operator from blocking ventilation to the internal components of the device encasement, give context to proper mounting orientations, and safeguard the device encasement against harmful external forces or conditions.

There are many drawbacks to known mount designs. Specifically, conventional mounts are typically not detachable, and mounts which are detachable typically require a non-standard attachment mechanism. For example, a typical LCD computer monitor might attach to an articulating arm using a clamp, but attach to a swiveling base using screws and attach to a wall using a keyhole slot. When these conventional fastening mechanisms are misplaced, as they often are, that particular mount is rendered useless until replacement parts can be located. Furthermore, conventional fastening mechanisms are often complex, require special tools and fasters, and offer no systematic approach to the installation. Moreover, consumers who lose small components or request mounting instructions may overwhelm call centers, requiring an increase in customer service staffing and increasing the total product costs to the manufacturer.

It is therefore considered highly desirable to provide a universal mounting system for attaching mounts to encasements, such as encasements which encase computing devices or the like. In particular, it is desirable to provide an easy-to-use, intuitive rail mounting system for attaching foot mounts, stands, and wall mounts to encasements, without using fasteners which can easily get lost.

SUMMARY OF THE INVENTION

The present invention relates to a mounting system and, more particularly, relates to the detachable mounting of encasements using dovetailing tenon rails and mortises affixed to the device encasement and mount, respectively.

According to one aspect, the present invention is a mounting system for a device encasement, including an elongated, T-shaped tenon rail, the T-shaped tenon being affixed to the device encasement. One or more detachable mounts may be detachably affixed to the T-shaped tenon rail. The T-shaped tenon rail is permanently affixed to the device encasement, or detachably affixed to the device encasement.

The at least one detachable mount is a wall mount, foot mount, or a stand. The at least one detachable mount mounts the device encasement vertically or horizontally, and includes a first detachable mount and a second detachable mount. By providing a variety of ways to mount a device, the present invention increases the flexibility and usability of a device, allowing a user to take the device encasement off a wall, for example, and use it on a desk in a different orientation or location. Furthermore, devices which can only be oriented in one direction need only include mounts or accept mounts which allow the user to mount the device encasement in that manner.

The device encasement encases a computing device, such as a thin client device. The device encasement could also encase any type of electrical or non-electrical device, including but not limited to a picture frame, a plasma or LCD monitor, a telephone, a hard disk drive, a camera, an amplifier, a speaker, et cetera.

The T-shaped tenon rail is comprised of plastic and/or metal, such as aluminum. While aluminum provides superior strength, plastic rails provide sufficient strength for most applications, and are cheaper and easier to manufacture.

The T-shaped tenon rail further includes at least a first projection, where the C-shaped mortise includes at least a first indentation, and where the first projection dovetails with the first indentation. Using a series of indentations and projections, the detachable mount can be held more into place more securely, minimizing the risk that the device encasement will accidentally slide off of the mount.

In alternative arrangements, the T-shaped tenon rail is detachably affixed to one peripheral surface of the device encasement, or at least one peripheral surface of the device encasement, or two adjacent peripheral surfaces of the device encasement, or two obverse peripheral surfaces of the device encasement, and is planar. Alternatively, the T-shaped tenon rail is detachably affixed to three peripheral surfaces of the device encasement in a planar U-shape.

According to a second aspect, the present invention is a mounting system for a device encasement, including an elongated, T-shaped tenon rail, the T-shaped tenon rail being affixed to the device encasement. The mounting system further includes an elongated, C-shaped mortise to which at least one of various mounts or stands can be affixed, where the C-shaped mortise may be detachably affixed to the T-shaped tenon rail.

The T-shaped tenon rail and C-shaped mortise provide an intuitive approach to device mounting, requiring no special tools or instructions. A user need only select the mount which is preferred for a particular situation, and slide the C-shaped mortise on the mount onto the T-shaped tenon rail affixed to the device encasement, and the device encasement is mounted. If the user wishes to mount the device encasement differently, the mount can be removed, and a different mount selected and attached in a similar manner.

The at least one detachable mount further includes a captive screw for securing the T-shaped tenon rail to the C-shaped mortise rail. Since the screw is captive, there is no danger that the screw will fall out or get lost, a design which is particularly important in workspaces where the present invention may be used, such as surgical wards, clean rooms, or aircraft maintenance facilities.

The T-shaped tenon rail and/or the C-shaped mortise are arc-shaped and/or linear. By placing a T-shaped tenon rail around the perimeter of the device encasement, the weight of the device encasement can be distributed more evenly across the entire surface of the device encasement when mounted or transported using the T-shaped tenon rail. Furthermore, the T-shaped tenon rail could be used as a carrying handle or even a shock absorber, in the event that the device encasement were dropped.

According to a third aspect, the present invention is a mounting system for a device encasement, including an elongated, T-shaped tenon rail, the T-shaped tenon rail being affixed to the device encasement. The mounting system further includes an elongated, C-shaped mortise having a stand, where the C-shaped mortise can be detachably affixed to the T-shaped tenon rail.

According to a fourth aspect, the present invention is a mounting system for a device encasement, including an elongated, T-shaped tenon rail, the T-shaped tenon rail being affixed to the device encasement. The mounting system further includes an elongated, C-shaped mortise having a wall mount, where the C-shaped mortise can be detachably affixed to the T-shaped tenon rail.

According to a fifth aspect, the present invention is a mounting system for a device encasement, including an elongated, T-shaped tenon rail, the T-shaped tenon rail being affixed to the device encasement. The mounting system further includes a U-shaped mortise to which at least one of various mounts or stands can be affixed, where the T-shaped tenon rail slidably engages the U-shaped mortise rail.

According to a sixth aspect, the present invention is a mounting system for a device encasement, including an elongated, T-shaped tenon rail, the T-shaped tenon rail being affixed to the device encasement. The mounting system further includes an elongated, C-shaped mortise which is designed to be coupled with a stand or a mount, where the C-shaped mortise may be detachably affixed to said T-shaped tenon rail. The C-shaped mortise is coupled with the stand or the mount through fabrication.

In the following description of the preferred embodiment, reference is made to the accompanying drawings that form a part thereof, and in which is shown by way of illustration a specific embodiment in which the invention may be practiced. It is to be understood that other embodiments may be utilized and changes may be made without departing from the scope of the present invention.

BRIEF DESCRIPTION OF THE DRAWINGS

Referring now to the drawings in which like reference numbers represent corresponding parts throughout.

DETAILED DESCRIPTION OF THE INVENTION

The present invention relates to a mounting system and, more particularly, relates to the detachable mounting of encasements for computing devices and the like using dovetailing tenon rails and mortises affixed to the device encasement and mount, respectively.

Figure 1:
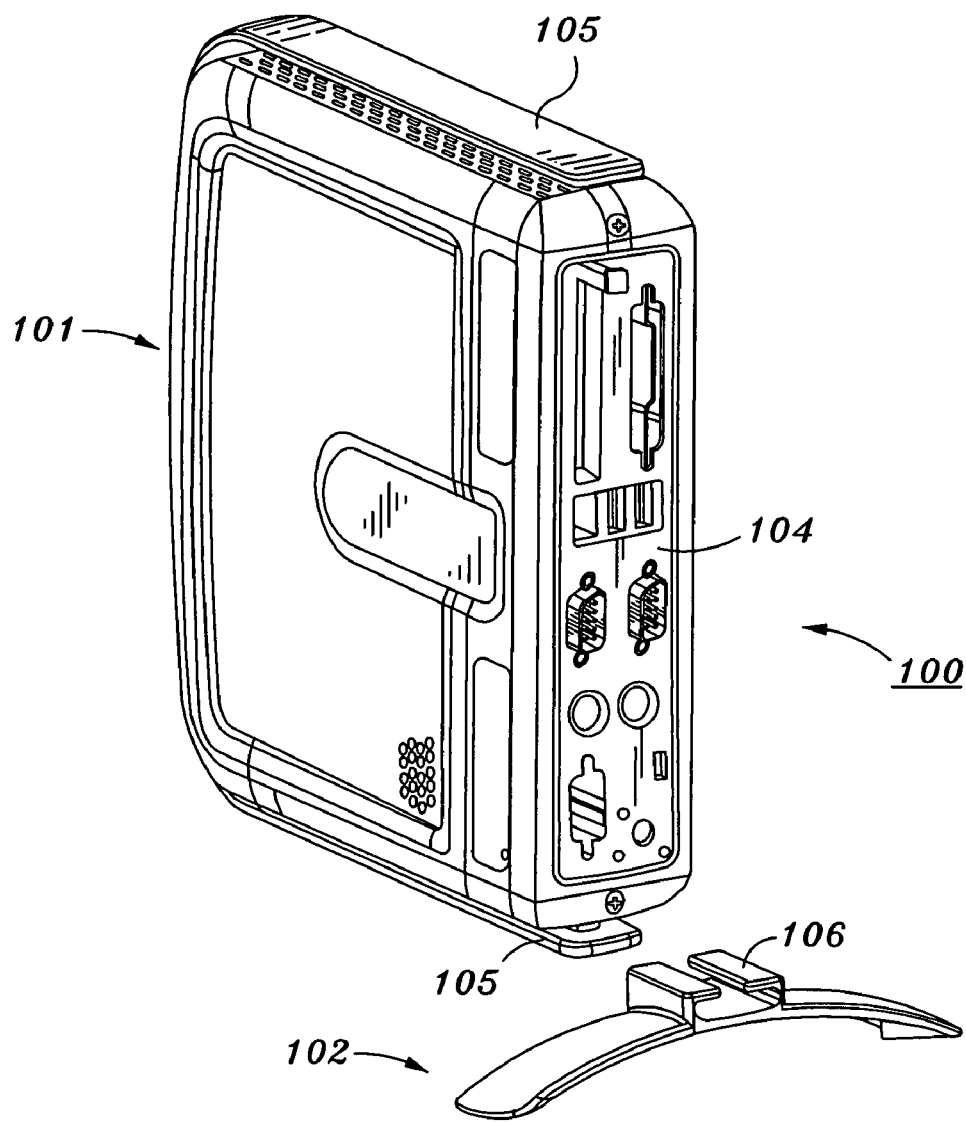
FIG. 1 depicts a rear perspective view of an example of a system for effectuating detachable mounting of a device encasement according to one embodiment of the present invention, in a state where a detachable mount is not mounted on an apparatus.

FIG. 1 depicts a rear perspective view of an example of a system for effectuating detachable mounting of a device encasement according to one embodiment of the present invention, in a state where a detachable stand or mount is not mounted on an apparatus. Briefly, the embodiments of the present invention illustrated in each of FIGS. 1 to 9 relate to a mounting system a device encasement, including an elongated, T-shaped tenon rail, the T-shaped tenon rail being affixed to the device encasement, where one or more detachable mounts may be detachably affixed to the T-shaped tenon rail. The T-shaped tenon rail is permanently affixed or detachably affixed to the device encasement.

In more detail, detachable mounting system 100 includes apparatus 101 for mounting. Apparatus 101 further includes device encasement 104 for encasing a device, and elongated, T-shaped tenon rail 105 affixed to or manufactured as part of device encasement 104, where a "tenon" is a projecting member in a piece of material which is shaped to fit into a mortise in another piece of material, to form a joint.

Detachable mounting system 100 also includes at least one detachable mount, including stand 102. Stand 102 further includes elongated, C-shaped mortise 106, where a "mortise" is a shaped slot cut into piece of material for a projecting part, or tenon, to be inserted into, in order to form a joint.

Figure 2A:
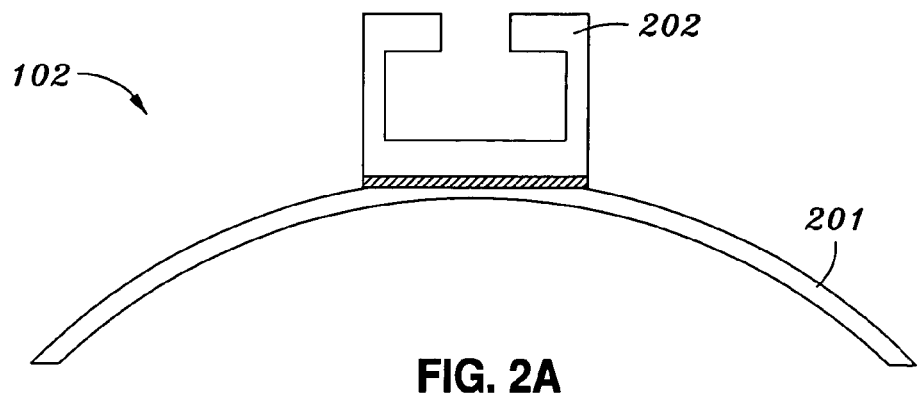
FIGS. 2A and 2B illustrate cross-sectional views of a detachable mount including a C-shaped mortise rail, according to an additional embodiment of the present invention.
Figure 2B:
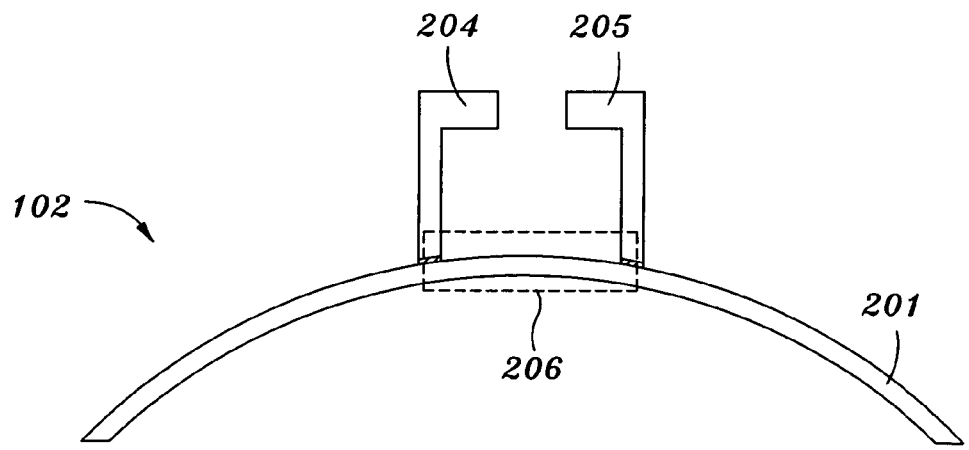

As depicted in FIG. 2, mortise 106 can be formed by affixing C-shaped part 202 to base portion 201 on stand 102, or mortise 106 can be formed by affixing two opposing L-shaped parts 204 and 205 directly to area 206 of base 201, where area 206 is used as a spine or connecting portion of C-shaped mortise 106.

Figure 3:
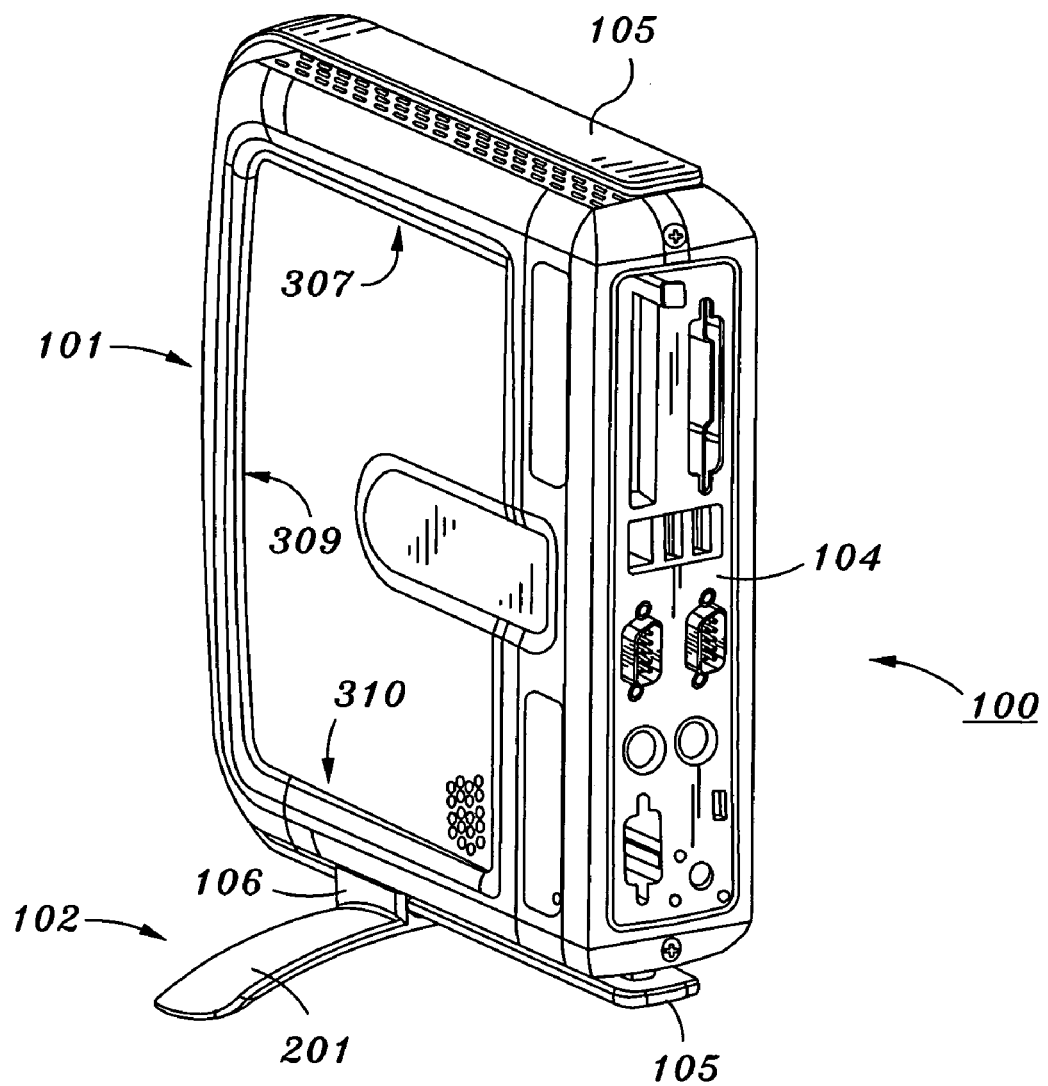
FIG. 3 depicts a rear perspective view of the FIG. 1 embodiment, in a state where the detachable mount is mounted on the apparatus.

FIG. 3 depicts a rear perspective view of the FIG. 1 embodiment, in a state where the detachable mount is detachably mounted on the apparatus. In particular, C-shaped mortise 106 detachably mounts with T-shaped tenon rail 105 either sliding or dovetailing C-shaped mortise 106 onto T-shaped tenon rail 105, or snapping C-shaped mortise 106 onto T-shaped tenon rail 105. C-shaped mortise 106 and T-shaped tenon rail 105 fit neatly together, and combine together smoothly and efficiently. The materials, dimensions and tolerances selected for construction of T-shaped tenon rail 105 and C-shaped mortise 106 should allow for the rails to be fit together and hold the rails together firmly, yet still allow for the tool-free removal of the rails from each other without a strenuous exertion of force by a user.

T-shaped tenon rail 105 and C-shaped mortise 106 provide an intuitive approach to encasement mounting, requiring no special tools or instructions. A user need only select the mount which is preferred for a particular situation, and slide C-shaped mortise 106 on stand 102 onto T-shaped tenon rail 105 affixed to device encasement 104, and device encasement 104 is detachably mounted. If the user wishes to mount device encasement 104 differently, stand 102 can be removed by hand, and a different mount (not depicted) can be selected and attached in a similar manner.

Device encasement 104 encases a computing device, such as a thin client device. In client/server applications, a "thin client" is a computing device designed to be especially small so that the bulk of the data processing occurs on a server. Device encasement 104 could also encase any type of mechanical or non-mechanical, electrical or non-electrical device, including but not limited to a picture frame, a plasma or LCD monitor, a telephone, a hard disk drive, a camera, an amplifier, a speaker, et cetera.

T-shaped tenon rail 105 and/or C-shaped mortise 106 are comprised of plastic and/or metal, such as aluminum. While aluminum provides superior strength and durability, plastic rails are cheaper and easier to manufacture.

T-shaped tenon rail 105 is affixed to one peripheral surface of device encasement 104, such as any one of peripheral surfaces 307, 309 or 310. In an alternate arrangement, T-shaped tenon rail 105 is affixed to two adjacent peripheral surfaces of the device encasement, such as peripheral surfaces 307 and 309, or peripheral surfaces 309 and 310. In a further alternate arrangement, T-shaped tenon rail 105 is affixed to two obverse peripheral surfaces of the device encasement, such as peripheral surfaces 307 and 310, and is planar, such that T-shaped tenon rail 105 is situated on a single plane. In an additional alternate arrangement, T-shaped tenon rail 105 is affixed to three peripheral surfaces of the device encasement, such as peripheral surfaces 307, 309 and 310, in a planar U-shape. T-shaped tenon rail 105 and/or C-shaped mortise 106 are arc-shaped and/or linear, or any combination thereof.

The at least one detachable mount is any type of mount, including but not limited to a wall mount, foot mount, or a stand. Briefly, the at least one detachable mount mounts device encasement 104 vertically or horizontally, and includes a first detachable mount and a second detachable mount. By providing a variety of ways to mount a device encasement, the present invention increases the flexibility and usability of a device, allowing a user to take the device off a wall, for example, and use it on a desk in a different orientation or location. Furthermore, devices which can only be oriented in one direction need only include mounts which allow the user to mount the device encasement in that manner.

Figure 4:
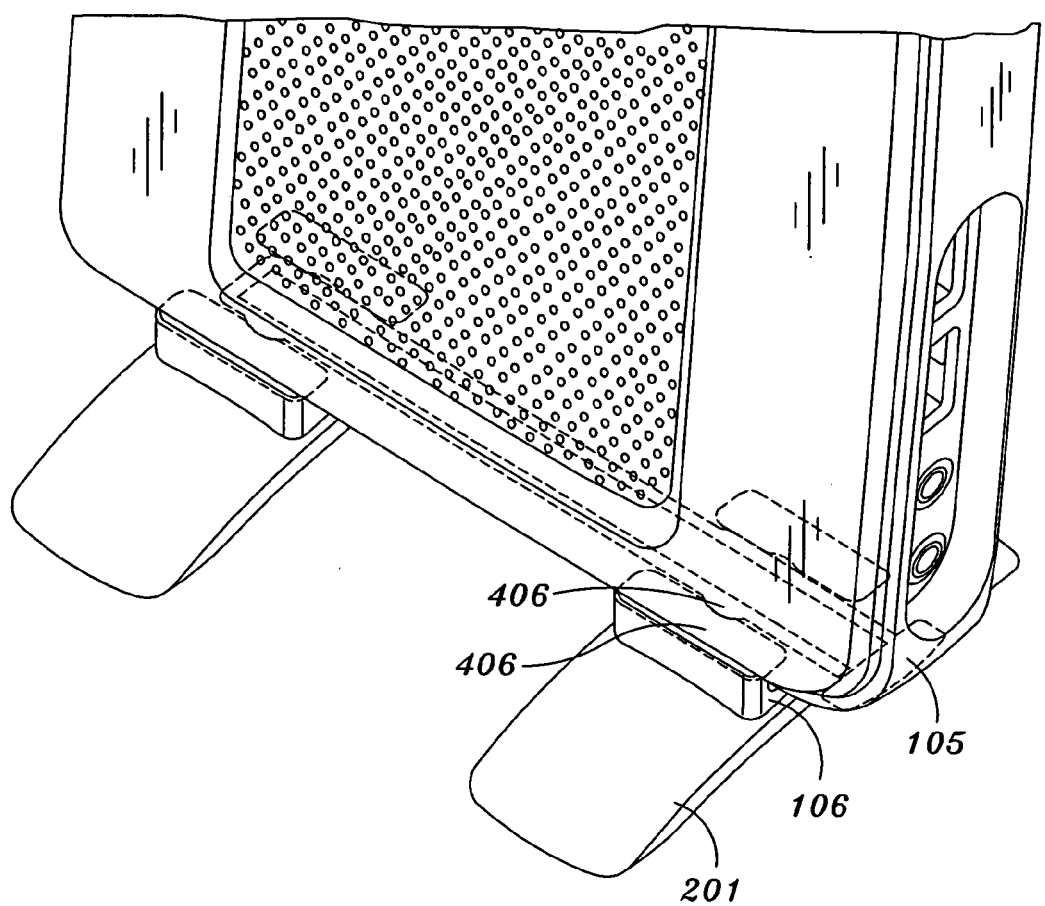
FIG. 4 shows an example of the indentations and projections formed on the C-shaped mortise and T-shaped tenon rail, respectively.

FIG. 4 shows a series of projections and indentations on T-shaped tenon rail 105 and C-shaped mortise 106, respectively, for holding encasement 104 securely in place. Briefly, the T-shaped tenon rail further includes at least a first projection, and the C-shaped mortise further includes at least a first indentation, where the first projection dovetails with the first indentation. In more detail, indentations 404 and 405 on C-shaped mortise 106 are of the same shape as projections 406 and 407 on T-shaped tenon rail 105. When mount 102 is placed onto apparatus 101 (by sliding C-shaped mortise 106 onto T-shaped tenon rail 105), the alignment of indentations 404 and 405 with projections 406 and 407 will be registered by the user as a "snapping" or "clicking" noise or sensation. Furthermore, the shape of the indentation and projections can be designed to offer a resistance to further motion, once aligned. In this regard, a mount which has been attached to an apparatus will be less likely to slide off.

Figure 5:
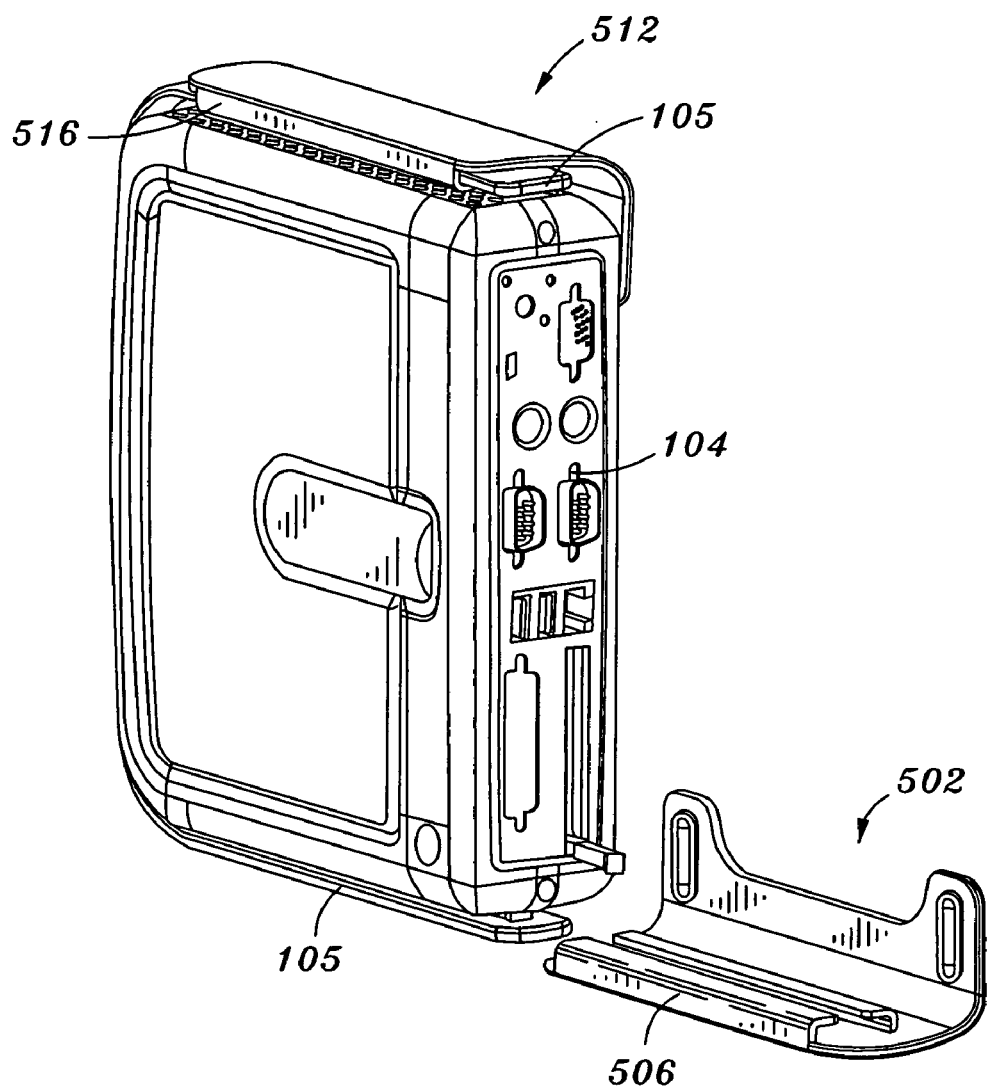
FIG. 5 depicts a rear perspective view of an example of a system for effectuating detachable mounting of a device encasement according to an additional embodiment of the present invention.

FIGS. 5 to 10 illustrate several example mounts, in various perspectives and states of attachment. In particular, FIG. 5 depicts a two-piece wall mount, including first detachable mount 502 and second detachable mount 512. First detachable mount 502 and second detachable mount 512 are designed to affixed to obverse ends of T-shaped tenon rail 105 on device encasement 104 via C-shaped mortises 506 and 516, respectively, and to a wall or other fixed object (not depicted). First detachable mount 502 and second detachable mount 512 allow device encasement 104 to be mounted vertically, horizontally, or at an angle.

As depicted in FIG. 5, apparatus 101 can be mounted by dovetailing an elongated T-shaped tenon rail 105 with two elongated, linear C-shaped mortises 506 and 516, where T-shaped tenon rail 105 is affixed to three peripheral surfaces of device encasement 104 in a planar U-shape, and where each of two C-shaped mortises 506 and 516 is affixed to one of two detachable mounts 502 and 512.

Figure 6:
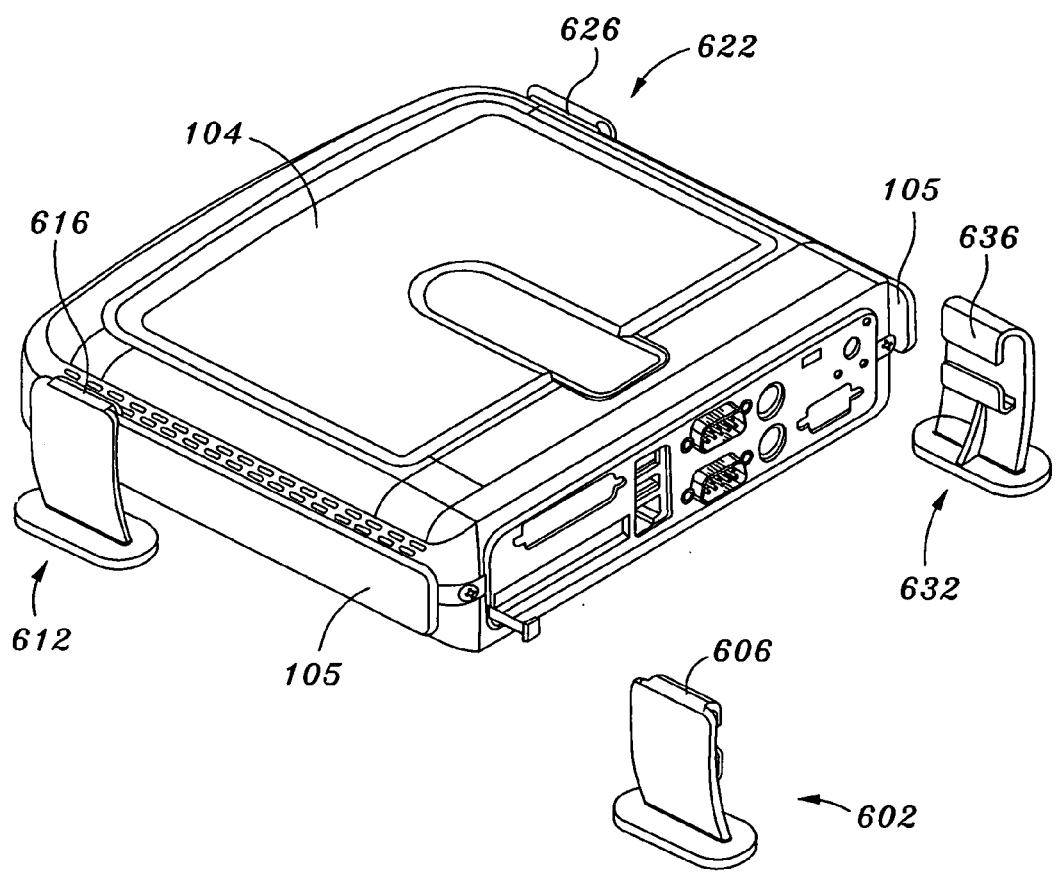
FIG. 6 depicts a rear perspective view of an example of a system for effectuating detachable mounting of a device encasement according to another embodiment of the present invention.

FIG. 6 depicts a four-piece stand, including first detachable mount 602, second detachable mount 612, third detachable mount 622, and fourth detachable mount 632. C-shaped mortises 606, 616, 626 and 636 are affixed to the plurality of detachable mounts, and are removably affixed with T-shaped tenon rail 105. Using the detachable mount arrangement depicted in FIG. 6, device encasement 104 should be mounted horizontally.

Figure 7A:
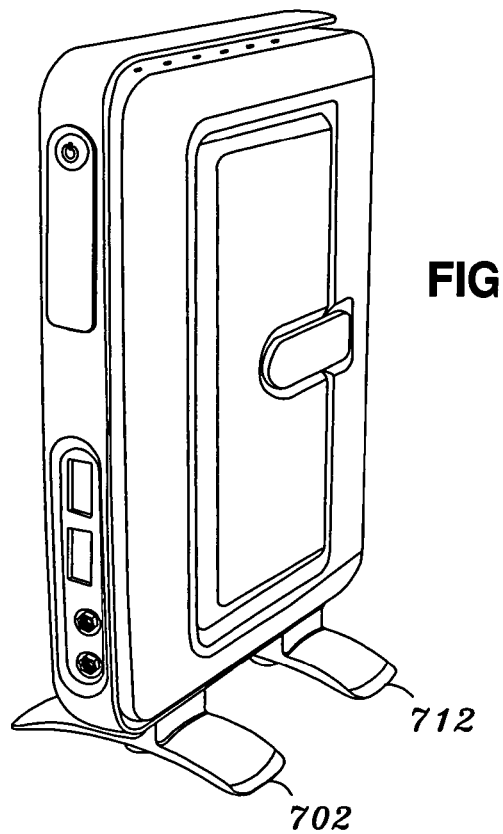
FIGS. 7A and 7B illustrate several examples of systems for effectuating detachable mounting of a device encasement according to additional embodiments of the present invention.

FIG. 7A depicts a front perspective view of a two-piece stand designed to mount apparatus 101 in a vertical orientation. Specifically apparatus 101 is mounted by attaching first detachable mount 702 and second detachable mount 712 via C-shaped mortises (unnumbered) to the same side of T-shaped tenon rail 105. Since apparatus 101 is mounted vertically and thus has a high center of gravity, first detachable mount 702 and second detachable mount 712 should be of sufficient size to prevent apparatus 101 from tipping over.

Figure 7B:
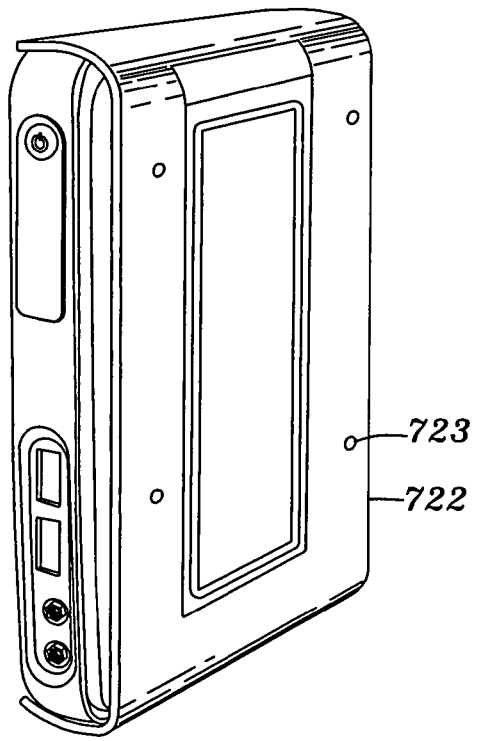

FIG. 7B depicts a front perspective view of a one-piece wall mount, which could be used to mount apparatus 101 in either a horizontal or vertical orientation. Specifically, apparatus 101 is mounted by dovetailing an T-shaped tenon rail 105 with two elongated, linear C-shaped mortises (unnumbered) on first detachable mount 722, where T-shaped tenon rail 105 is affixed to at least two peripheral surfaces of apparatus 101 in a planar U-shape, and where each of the two C-shaped mortises is affixed to one of the two detachable mounts. Detachable mount 722 further includes mounting holes, such as hole 723, to allow detachable mount 722 to be affixed to a wall or other fixed object using screws or nails. The location of these holes is preferably in compliance with Video Electronics Standards Association ("VESA") mounting specifications.

As depicted in FIG. 7B, apparatus 100 is mounted by dovetailing elongated T-shaped tenon rail 105 with at least one elongated, linear C-shaped mortise (unnumbered), where T-shaped tenon rail 105 is affixed to three peripheral surfaces of the device encasement in a planar U-shape, and where the at least one (unnumbered) C-shaped mortise is affixed to detachable mount 722.

Figure 8A:
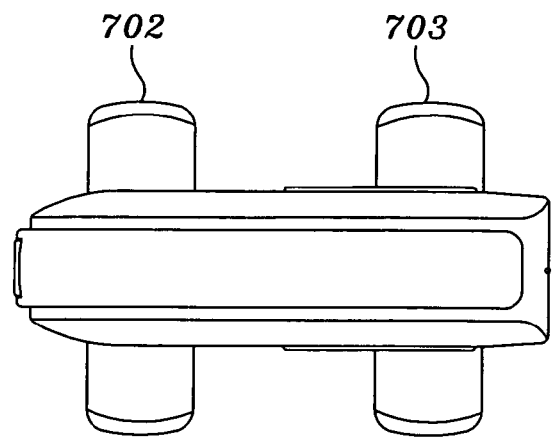
FIG. 8 depicts top, side, and front views of the FIG. 7A embodiment.
Figure 8B:
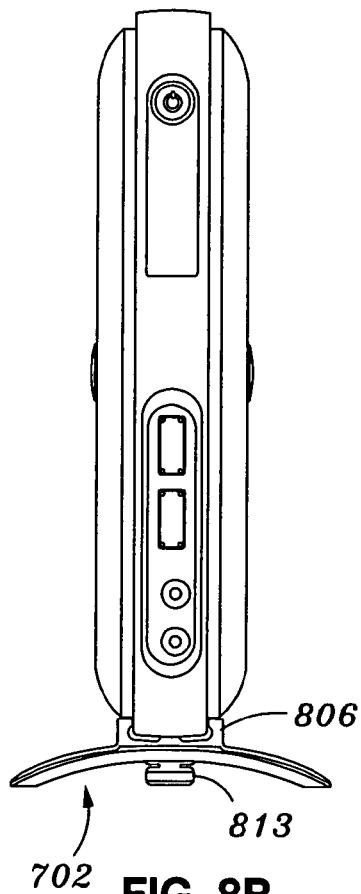
Figure 8C:
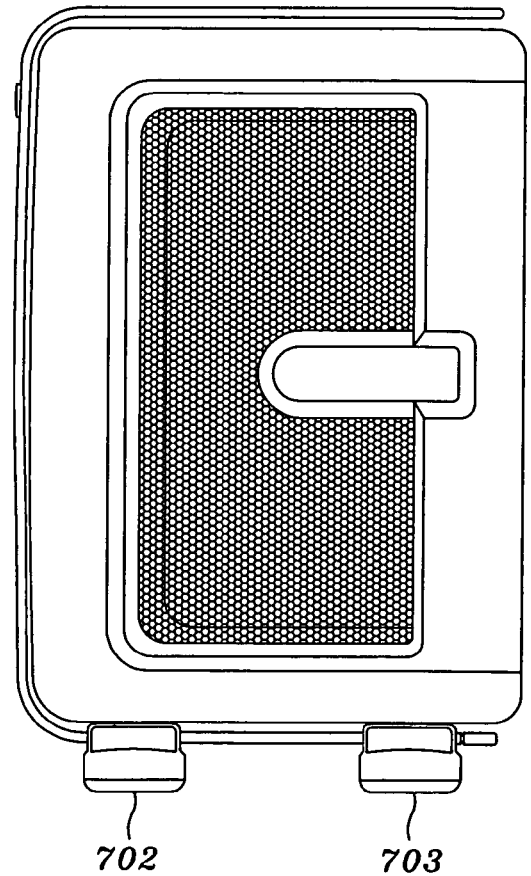

FIG. 8 depicts top, side, and front views of the FIG. 7A embodiment. In addition to the features described above, FIG. 8 shows that C-shaped mortise 806 is secured to T-shaped tenon rail 105 by tightening captive screw 813 on mount 702. Since the screw is captive, there is little danger that the screw will fall out or get lost, which is particularly important in certain workspaces where the present invention may be used, such as in spacecraft, surgical wards, clean rooms, or in aircraft maintenance facilities. The C-shaped mortise and the T-shaped tenon rail include indentations for securing the T-shaped tenon rail to the C-shaped mortise rail.

Figure 9:
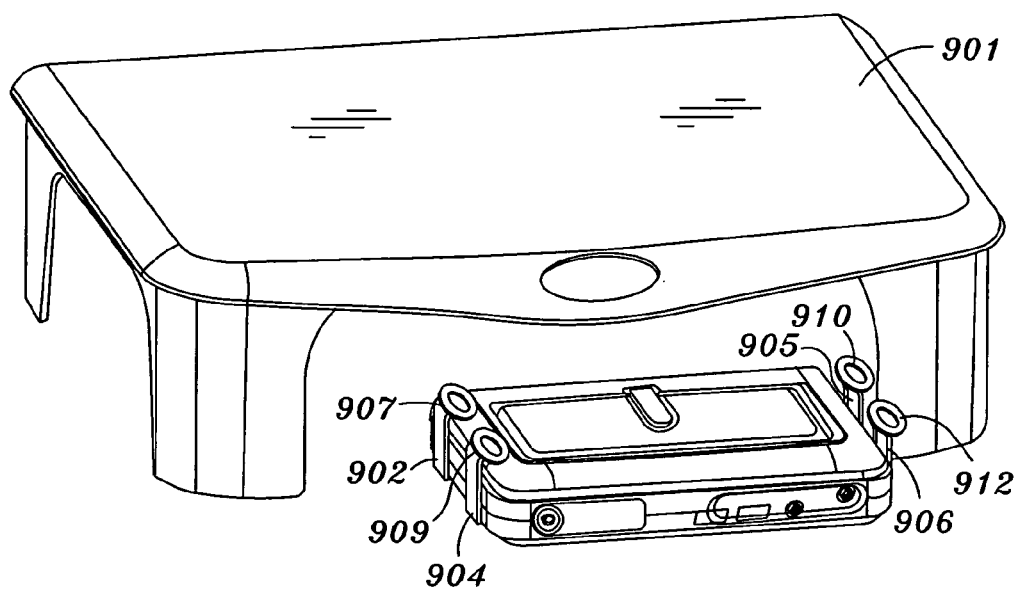
FIG. 9 illustrates a front perspective view of an example of a system for effectuating detachable mounting of a device encasement according to another embodiment of the present invention.

FIG. 9 is a front perspective view of an example of a system for effectuating detachable mounting of a device encasement according to another embodiment of the invention, including a monitor stand. In particular, FIG. 9 illustrates monitor stand 901, for supporting a computer monitor (not shown). First detachable mount 902, second detachable mount 904, third detachable mount 905 and fourth detachable mount 906 include interfaces 907, 909, 910 and 912 for attaching to the underside of monitor stand 901.

Figure 10A:
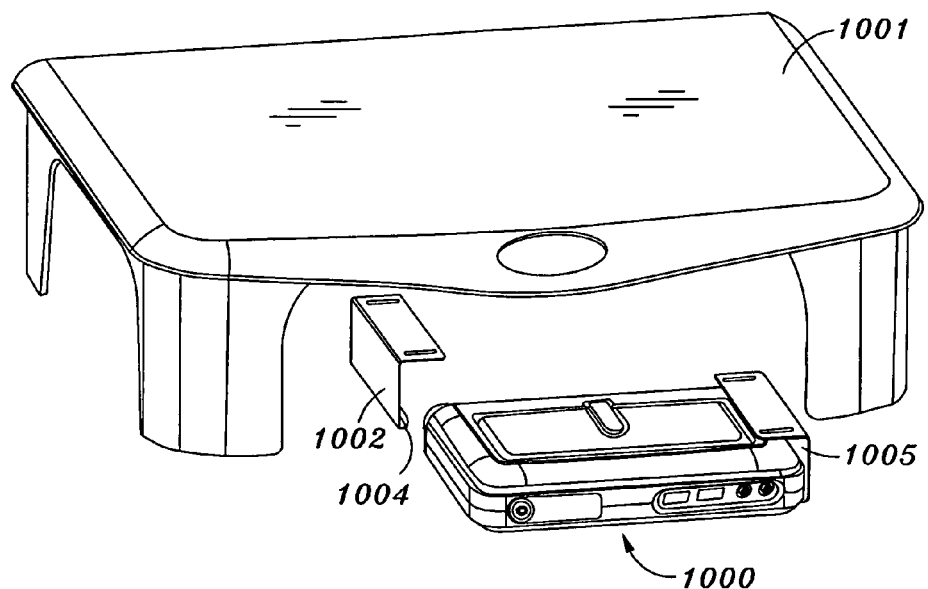
FIGS. 10A to 10C depict a front perspective view of an example of a system for effectuating detachable mounting of a device encasement according to a further embodiment of the present invention.

FIG. 10A is a front perspective view of an example of a system for effectuating detachable mounting of a device encasement according to a further embodiment of the invention. Briefly, the mounting system for a device encasement depicted in FIG. 10A includes an elongated, T-shaped tenon rail, the T-shaped tenon rail being affixed to the device encasement, and an elongated, U-shaped mortise to which at least one of various mounts or stands can be affixed. The T-shaped tenon rail slidably engages the U-shaped mortise rail.

Figure 10C:
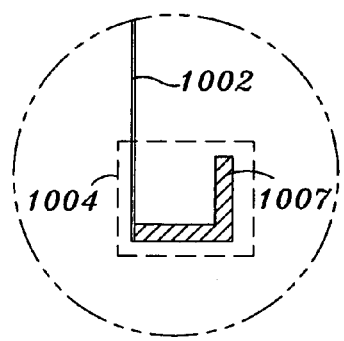
Figure 10B:
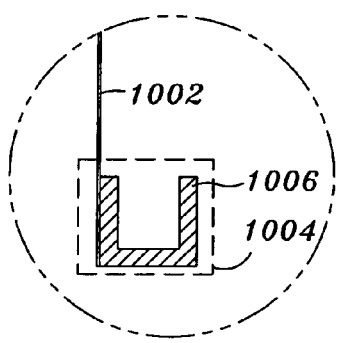

In more detail, FIG. 10A illustrates monitor stand 1001 for supporting a computer monitor (not depicted). First detachable mount 1002 and second detachable mount are designed to be attached to the underside of monitor stand 1001. As shown in FIGS. 10B and 10C, first detachable mount 1002 includes a U-shaped mortise rail. The U-shaped mortise can be formed by adding U-shaped component 1006 to detachable mount 1002 (FIG. 10B), or the U-shaped mortise can be fashioned by adding L-shaped component 1007 to detachable mount 1002, forming a U-shape (FIG. 10C).

In an additional aspect of the invention, an elongated T-shaped tenon rail is detachably affixed with at least one elongated, linear C-shaped mortise rail, where the T-shaped tenon rail is affixed to three peripheral surfaces of the device encasement in a planar U-shape, and where the at least one C-shaped mortise is affixed to the detachable mount. The at least one C-shaped mortise is secured to the T-shaped tenon rail by tightening a captive screw on the detachable mount.

According to a further aspect, an elongated T-shaped tenon rail is detachably affixed with two elongated, linear C-shaped mortises, where the T-shaped tenon rail is affixed to three peripheral surfaces of the device encasement in a planar U-shape, and where each of the two C-shaped mortises is affixed to one of the two detachable mounts. Each of the two C-shaped mortises are secured to the T-shaped tenon rail by tightening a captive screw on each of the two detachable mount.

According to a another aspect, the present invention is a mounting system for a device encasement, including an elongated, T-shaped tenon rail, the T-shaped tenon rail being affixed to the device encasement. The mounting system further includes an elongated, C-shaped mortise which is designed to be coupled with a stand or a mount, where the C-shaped mortise may be detachably affixed to said T-shaped tenon rail. The C-shaped mortise is coupled with the stand or the mount through fabrication.

The invention has been described with particular illustrative embodiments. It is to be understood that the invention is not limited to the above-described embodiments and that various changes and modifications may be made by those of ordinary skill in the art without departing from the spirit and scope of the invention.

What is claimed is:

1. A mounting system for a device encasement, comprising:
a device encasement;
an elongated, T-shaped tenon rail, said T-shaped tenon rail being affixed to the device encasement,
wherein one or more detachable mounts may be detachably affixed to said T-shaped tenon rail, and
wherein said T-shaped tenon rail is affixed to at least two obverse peripheral surfaces of said device encasement.

2. A mounting system for a device encasement according to claim 1, wherein said T-shaped tenon rail is permanently affixed to the device encasement.

3. A mounting system for a device encasement according to claim 1, wherein said device encasement encases a computing device.

4. A mounting system for a device encasement according to claim 1, wherein said T-shaped tenon rail is comprised of plastic.

5. A mounting system for a device encasement according to claim 1, wherein said T-shaped tenon rail is affixed to at least one peripheral surface of said device encasement.

6. A mounting system for a device encasement according to claim 1, further comprising an elongated C-shaped mortise;
wherein said T-shaped tenon rail further comprises at least a first projection,
wherein said C-shaped mortise comprises at least a first indentation, and
wherein said first projection dovetails with said first indentation.

7. A mounting system for a device encasement, comprising:
a device encasement;
an elongated, T-shaped tenon rail, said T-shaped tenon rail being affixed to the device encasement; and an elongated, C-shaped mortise to which at least one of various mounts or stands can be affixed,
wherein said C-shaped mortise may be detachably affixed to said T-shaped tenon rail, and
wherein said T-shaped tenon rail is affixed to at least two obverse peripheral surfaces of said device encasement.

8. A mounting system for a device encasement according to claim 7, wherein said device encasement encases a computing device.

9. A mounting system for a device encasement according to claim 7, wherein said C-shaped mortise is comprised of plastic.

10. A mounting system for a device encasement according to claim 7, wherein said T-shaped tenon rail is affixed to at least one peripheral surface of said device encasement.

11. A mounting system for a device encasement according to claim 7, wherein said at least one detachable mount further includes a captive screw for securing said T-shaped tenon rail to said C-shaped mortise rail.

12. A mounting system for a device encasement according to claim 7,
wherein said T-shaped tenon rail further comprises at least a first projection,
wherein said C-shaped mortise comprises at least a first indentation, and
wherein said first projection dovetails with said first indentation.

13. A mounting system for a device encasement, comprising:
a device encasement;
an elongated, T-shaped tenon rail, said T-shaped tenon rail being affixed to the device encasement; and
an elongated, C-shaped mortise having a stand,
wherein said C-shaped mortise can be detachably affixed to said T-shaped tenon rail, and
wherein said T-shaped tenon rail is affixed to at least two obverse peripheral surfaces of said device encasement.

14. A mounting system for a device encasement according to claim 13, wherein said T-shaped tenon rail is affixed to at least one peripheral surface of said device encasement.

15. A mounting system for a device encasement according to claim 13, wherein said T-shaped tenon rail is affixed to three peripheral surfaces of said device encasement in a planar U-shape.

16. A mounting system for a device encasement according to claim 13, wherein said at least one detachable mount further includes a captive screw for securing said T-shaped tenon rail to said C-shaped mortise rail.

17. A mounting system for a device encasement according to claim 13,
wherein said T-shaped tenon rail further comprises at least a first projection,
wherein said C-shaped mortise comprises at least a first indentation, and
wherein said first projection dovetails with said first indentation.

18. A mounting system for a device encasement, comprising:
a device encasement;
an elongated T-shaped tenon rail, said T-shaped tenon rail being affixed to the device encasement; and
an elongated C-shaped mortise having a wall mount,
wherein said C-shaped mortise can be detachably affixed to said T-shaped tenon rail, and
wherein said T-shaped tenon rail is affixed to at least two obverse peripheral surfaces of said device encasement.

19. A mounting system for a device encasement according to claim 18, wherein said T-shaped tenon rail is affixed to at least one peripheral surface of said device encasement.

20. A mounting system for a device encasement according to claim 18, wherein said at least one detachable mount further includes a captive screw for securing said T-shaped tenon rail to said C-shaped mortise rail.

21. A mounting system for a device encasement according to claim 18,
wherein said T-shaped tenon rail further comprises at least a first projection,
wherein said C-shaped mortise comprises at least a first indentation, and
wherein said first projection dovetails with said first indentation.

22. A mounting system for a device encasement, comprising:
a device encasement;
an elongated, T-shaped tenon rail, said T-shaped tenon rail being affixed to the device encasement; and
an elongated, U-shaped mortise to which at least one of various mounts or stands can be affixed,
wherein said T-shaped tenon rail slidably engages said U-shaped mortise rail, and
wherein said T-shaped tenon rail is affixed to at least two obverse peripheral surfaces of said device encasement.

23. A mounting system for a device encasement according to claim 22, wherein said device encasement encases a computing device.

24. A mounting system for a device encasement according to claim 22, wherein said T-shaped tenon rail is comprised of plastic.

25. A mounting system for a device encasement according to claim 22, wherein said C-shaped mortise is comprised of plastic.

26. A mounting system for a device encasement according to claim 22, wherein said T-shaped tenon rail is affixed to at least one peripheral surface of said device encasement.

27. A mounting system for a device encasement, comprising:
a device encasement;
an elongated, T-shaped tenon rail, said T-shaped tenon rail being affixed to the device encasement; and
an elongated, C-shaped mortise which is designed to be coupled with a stand or a mount,
wherein said C-shaped mortise may be detachably affixed to said T-shaped tenon rail, and
wherein said T-shaped tenon rail is affixed to at least two obverse peripheral surfaces of said device encasement.

28. A mounting system for a device encasement according to claim 27, wherein said C-shaped mortise is coupled with the stand or the mount through fabrication.

* * * * *

UNITED STATES PATENT AND TRADEMARK OFFICE
CERTIFICATE OF CORRECTION

PATENT NO.       : 7,134,635 B2
APPLICATION NO.  : 10/949201
DATED            : November 14, 2006
INVENTOR(S)      : Burriel et al.

It is certified that error appears in the above-identified patent and that said Letters Patent is hereby corrected as shown below:

In the Drawings:

Replace Fig. 4 with the following Fig. 4:

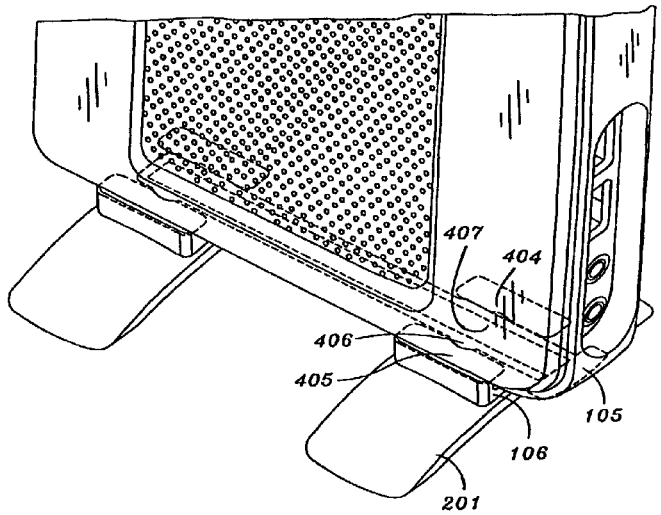

FIG. 4

UNITED STATES PATENT AND TRADEMARK OFFICE
CERTIFICATE OF CORRECTION

PATENT NO. : 7,134,635 B2  
APPLICATION NO. : 10/949201  
DATED : November 14, 2006  
INVENTOR(S) : Burriel et al.

Page 2 of 2

It is certified that error appears in the above-identified patent and that said Letters Patent is hereby corrected as shown below:

Replace Fig. 5 with the following Fig. 5:

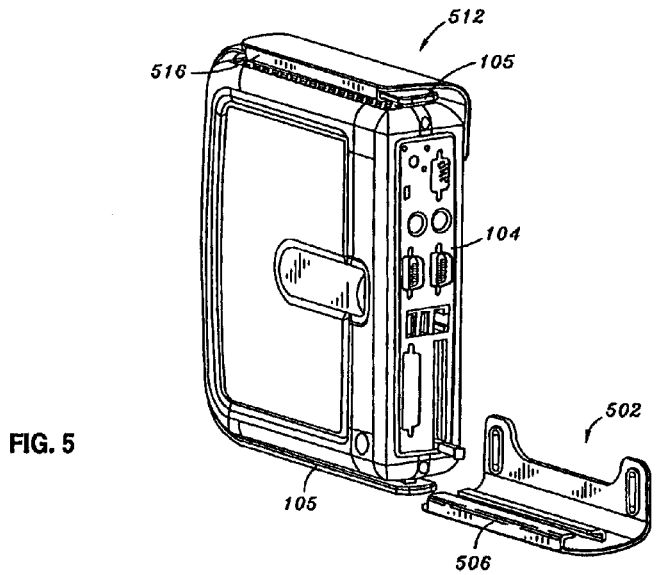

FIG. 5

In column 5, line 57, replace "surfaces 307,309" with -- surfaces 307, 309 --.

Signed and Sealed this

Twenty-ninth Day of April, 2008

JON W. DUDAS  
*Director of the United States Patent and Trademark Office*